United States Patent [19]

Shiota

[11] 4,455,568

[45] Jun. 19, 1984

[54] INSULATION PROCESS FOR INTEGRATED CIRCUITS

[75] Inventor: Philip Shiota, Saratoga, Calif.

[73] Assignee: American Microsystems, Inc., Santa Clara, Calif.

[21] Appl. No.: 296,734

[22] Filed: Aug. 27, 1981

[51] Int. Cl.[3] .................... H01L 29/34; H01L 29/04; H01L 29/78

[52] U.S. Cl. ........................................ 357/54; 357/59; 357/23.6; 357/23.5

[58] Field of Search ............ 357/23 C, 59, 54, 23 VT

[56] References Cited

U.S. PATENT DOCUMENTS

| | | | |
|---|---|---|---|
| 3,570,114 | 3/1971 | Bean et al. | 357/59 |
| 3,689,392 | 9/1972 | Sandera | 357/54 |
| 3,737,743 | 6/1973 | Goronkin et al. | 357/54 |
| 3,764,423 | 10/1973 | Hauser, Jr. et al. | 357/54 |
| 3,877,053 | 4/1975 | Kaplit | 357/23 C |
| 4,270,262 | 6/1981 | Hori et al. | 357/23 C |

OTHER PUBLICATIONS

Tasch et al., *IEEE Trans on Elect. Devices* vol. ED-25, No. 1, Jan. 1978, pp 33-41 "The Hi-C RAM Cell Concept".

Posa J. G., *Electronics* May 22, 1980, pp. 119-129, "What to Expect Next: A Special Report".

Primary Examiner—Martin H. Edlow
Assistant Examiner—Jerome Jackson
Attorney, Agent, or Firm—Skjerven, Morrill, MacPherson & Drucker

[57] ABSTRACT

Capacitors or dual layer metalization interconnects are formed in an integrated circuit utilizing two layers of polycrystalline silicon (22, 24) separated by a thin insulation region (23). The insulation region formed between the two polycrystalline silicon regions has substantially fewer defects than the insulation regions used in prior art techniques due to the use of a unique process wherein the polycrystalline silicon layer (24) overlying the insulation layer (23) protects the insulation layer from attack during subsequent processing. An improved dielectric strength is provided by forming the insulation region (23) utilizing composite layers of silicon oxide (23a, 23c) and silicon nitride (23b).

9 Claims, 11 Drawing Figures

INSULATION PROCESS FOR INTEGRATED CIRCUITS

BACKGROUND OF THE INVENTION

1. Field of the Invention

This invention relates to integrated circuit devices, and more specifically to an insulation means useful in the construction of integrated circuits containing capacitors and dual layer electrical interconnects.

2. Description of the Prior Art

Prior art devices utilizing dual aluminum metalization layers are described in U.S. Pat. Nos. 3,931,674 and 3,586,922. A cross sectional view of a typical prior art integrated circuit device is also shown in FIG. 1. On semiconductor substrate 11 is formed insulation region 99 (preferably silicon dioxide) and polycrystalline silicon region 12 preferably selectively doped to a desired conductivity. Isolation oxide regions 13 are then formed surrounding polycrystalline silicon (polysilicon) region 12. A thin oxide layer 14 is formed (typically either deposited or thermally grown) directly over polysilicon layer 12, typically by thermal oxidation. Aluminum layer 15 is then formed over oxide layer 14. In this fashion, a prior art capacitor is formed having a first plate comprising polysilicon region 12, a second plate comprising aluminum region 15, and a dielectric formed therebetween comprising silicon dioxide (commonly referred to as "oxide") region 14. In order to form an effective capacitor utilizing this prior art method, oxide region 14 must be quite thin, typically on the order of 600 angstroms.

The same technique may be utilized to form an integrated circuit with dual layer electrical interconnects. In this case, however, oxide layer 14 is grown to be much thicker than the thickness utilized when forming capacitors. For example, oxide layer 14 is typically formed to a thickness of approximately 2000-6000 angstroms when polysilicon region 12 and aluminum region 15 are to be used as dual layer interconnects, rather than as a capacitor.

The primary disadvantage in forming dual layer interconnects or capacitors for use in integrated circuits utilizing this prior art technique is the presence of defects or pin holes in oxide layer 14. Such a defect or pin hole will result in a reduced oxide thickness. If a pin hole is present in oxide layer 14, the dielectric strength of oxide layer 14 will be greatly reduced, thus allowing electrical breakdown of layer 14 and the resultant formation of shorts between polysilicon region 12 and aluminum region 15. In the case of a severe pin hole, a portion of polysilicon region 12 will not be covered by oxide 14 and aluminum region 15 will be formed in such a manner that aluminum will be placed in the pin hole and in direct contact with polysilicon region 12, thus forming a direct short circuit during fabrication. The presence of pin holes in oxide region 14 is a widespread problem in the manufacture of such prior art devices. The formation of low defect thin oxide regions is difficult, due to the presence of contaminants on the surface of polysilicon region 12. The formation of pin holes in oxide region 14 is further aggravated by chemical attacks upon oxide region 14 by chemicals used in subsequent processing, including the patterning of aluminum region 15. Typical etchants (eg. hydrofloric acid) used to pattern aluminum also attack the silicon oxide used as the dielectric in prior art capacitors.

The use of polycrystalline silicon to serve as a mask during doping of underlying regions has been taught by Amelio and Salsbury in U.S. Pat. No. 3,836,409. However, no mention is made of the use of portions of polycrystalline silicon to protect an underlying insulation layer from inadvertent chemical attack during subsequent processing.

SUMMARY OF THE INVENTION

This invention utilizes a unique process wherein capacitors and dual layer polycrystalline silicon (often called "polysilicon") interconnects are formed in an integrated circuit utilizing two layers of polycrystalline silicon separated by a thin insulation region. The use of polycrystalline silicon as capacitor plates allows the polysilicon to be patterned (eg. by etching with $CF_4$ plasma) without damaging the insulation layers, thus preventing undesired electrical shorts. The insulation region is uniquely formed between the two polycrystalline silicon regions so as to have substantially fewer defects than the insulation regions used in prior art techniques. A low defect insulation region is achieved by the unique process of this invention wherein the polycrystalline silicon layer overlying the insulation layer protects the insulation layer from chemical attack during subsequent processing. In one embodiment, the insulation region between the two polycrystalline silicon regions comprises silicon nitride. Silicon nitride has a higher dielectric constant than the silicon dioxide used as the dielectric in prior art capacitors formed on integrated circuit devices. The higher dielectric constant of silicon nitride allows thicker dielectric regions to be formed, thus having fewer defects than prior art dielectrics of similar size and capacitance values.

BRIEF DESCRIPTION OF THE DRAWING

FIG. 3b is a graphical representation of the dielectric strength of the device of FIG. 3a.

FIG. 4b is a graphical representation of the dielectric strength of the device of FIG. 4a.

DETAILED DESCRIPTION OF THE INVENTION

Figure 1:
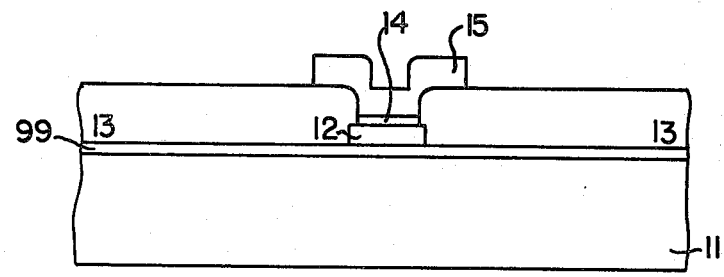
FIG. 1 is a cross sectional view of a typical prior art device utilizing dual interconnect layers.

Cross sectional views of a device constructed in accordance with this invention are shown in FIGS. 2a-2f. Semiconductor substrate 21 of FIG. 2a contains various regions (not shown) which have been formed in order to fabricate various semiconductor devices. On the surface of semiconductor substrate 21 is formed an insulation layer 89 (preferably silicon dioxide), and a first layer of polycrystalline silicon 22. Insulation layer 89 may contain contact openings, thus allowing polysilicon layer 22 to contact, and thus provide electrical connection to, selected regions formed within substrate 21. Polysilicon layer 22 is then doped (typically with phosphorus dopant) to achieve the desired conductivity. Preferably, a thin layer of oxide approximately 400 angstroms thick is formed on the top surface of polysilicon region 22 to allow better adhesion of the photoresist used in the next step of patterning polysilicon layer 22, although this step is not essential. For reasons of clarity, this thin layer of oxide is not shown in the drawings.

Figure 2A:
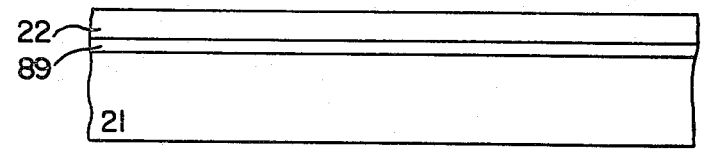
FIGS. 2a-2f are cross sectional views of a device during the steps of its fabrication in accordance with the present invention.
Figure 2B:
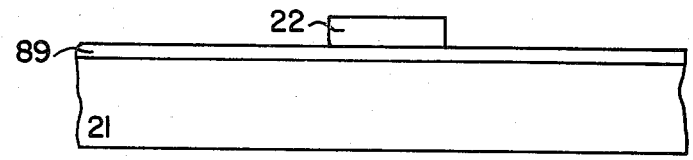
Figure 2C:
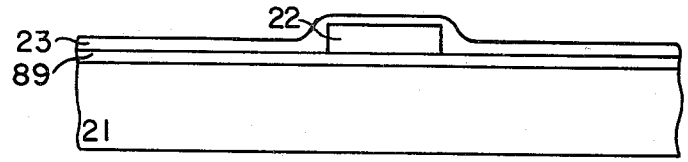

Polycrystalline silicon (polysilicon) region 22 of FIG. 2b is then patterned utilizing well-known masking and etching techniques. Polysilicon region 22 may be used as one plate of a capacitor, a conductive interconnect, a gate element of a metal oxide silicon (MOS) transistor, or serve as a combination of these functions. A thin insulating layer 23 is then formed over the entire surface of the wafer, and thus over polysilicon region 22, as shown in FIG. 2c. Insulation layer 23 is preferably silicon nitride, although it may be silicon dioxide, a layer comprised of composite layers of silicon dioxide and silicon nitride, or other suitable insulating material. The thickness of this insulation is approximately 300 angstroms if capacitors are formed and approximately 2,000 angstroms if dual layer polysilicon interconnects are formed.

Figure 2D:
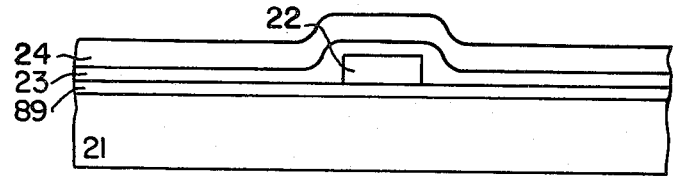
Figure 2E:
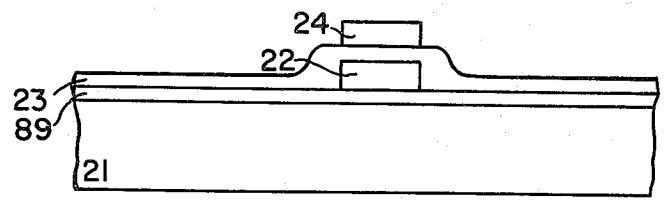

A second polycrystalline silicon layer 24 is then formed over the entire surface of insulation region 23, as shown in FIG. 2d. Polycrystalline silicon layer 24 is then doped (typically with phosphorus) to achieve the desired conductivity and patterened utilizing well-known techniques into a plurality of regions of which polycrystalline silicon region 24 is shown in FIG. 2e. Unused portions of the polycrystalline silicon layer 24 formed over insulation layer 23 are removed utilizing a suitable etchant, such as plasma etching utilizing $CF_4$. Of importance, during the etching of the undesired portions of the polycrystalline silicon layer formed on insulation layer 23, polycrystalline silicon region 24 serves to protect that portion of the insulation region 23 located between polycrystalline silicon regions 22 and 24, thus providing an insulation region 23 between polysilicon regions 22 and 24 having fewer defects than are present in insulation region 14 of the prior art device shown in FIG. 1. In a similar manner, polysilicon 24 protects the insulation 23 during all subsequent processing steps. Thus, utilizing the present invention fewer defects will be present in the insulation 23 located between polysilicon regions 22 and 24 than in prior art devices, because polysilicon region 24 has protected the insulation region 23 from chemcial attack during processing performed subsequent to the formation of insulation region 23. Furthermore, prior art devices utilizing aluminum as the conductors generally require that the aluminum be patterned by etching with a solution of phosphoric, acetic and nitric acids, which also attacks oxide serving as an insulator. The etch rate of $CF_4$ plasma, used to etch the polycrystalline silicon regions 22 and 24, on oxide is significantly less than the oxide etch rate of the phosphoric, acetic, nitric acid solution used to etch aluminum.

The technique of this invention is utilized to form capacitors for use in integrated circuits, in which case insulation region 23 will have a preferred thickness of approximately 600 angstroms, thus providing a dielectric strength of approximately 40 volts if insulation region 23 is comprised of silicon nitride. This invention is also utilized to form dual layer polysilicon interconnects for use in integrated circuits, wherein insulation region 23 has a preferred thickness of approximately 2,000 angstroms, thus increasing the dielectric strength of region 23 and reducing capacitance coupling between polysilicon regions 22 and 24. In both cases, insulation region 23 formed in accordance with this invention will have fewer defects than the insulation regions formed utilizing prior art techniques. After the patterning of polysilicon layer 24, isolation oxide 25 is formed over the entire surface of the semiconductor wafer. Selected portions of isolation oxide 25 are then etched utilizing well-known techniques to form contact openings (not shown) to provide electrical connection to the various regions located within substrate 21 and to desired portions of polycrystalline silicon regions 22 and 24.

The structure of this invention is fabricated utilizing the following process, for example. Substrate 21 is a semiconductor substrate such as silicon. Silicon dioxide layer 89 is formed, for example, by thermal oxidation of substrate 21. Silicon dioxide layer 89 is formed to a thickness of approximately 830Å, for example, by thermal oxidation in dry oxygen for approximately 70 minutes at approximately 1,000° C. Polycrystalline silicon region 22 is formed (FIG. 2a) by first cleaning the surface of silicon dioxide layer 89, for example by rinsing silicon dioxide layer 89 for ten seconds in a buffered hydrofluoric acid solution, followed by a rinse with deionized water, and then drying layer 89. A layer of polycrystalline silicon is formed across the entire surface of silicon dioxide layer 89, as shown in FIG. 2a, to a thickness of approximately 4,250 angstroms utilizing well-known low pressure (less than 1 atmosphere) chemical vapor deposition techniques.

The polycrystalline silicon layer 22 is then cleaned for approximately ten seconds in a buffered hydrofluoric acid bath. The wafer is then rinsed and dried, and phosphorus dopant is deposited by ramping the wafer to approximately 970° C. in approximately five minutes in an oxygen environment, subjecting the wafer to phosphorus deposition by maintaining the wafer in an ambient of oxygen and $POCl_3$ gas at approximately 970° C. for approximately eight minutes, and then reducing the temperature of the wafer to room temperature within approximately two minutes in an oxygen environment. Any phosphorus/polysilicon glass formed on the surface of polysilicon layer 22 is removed by etching with a buffered hydrofluoric acid solution, followed by a rinse and a dry. The V/I characteristics of the polycrystalline silicon layer 22 after this phosphorus deposition is approximately 3.0 ohms.

A thin layer of oxide (not shown) is then formed using thermal oxidation on polycrystalline silicon layer 22 by subjecting the wafer to a five minute ramp up in dry oxygen to 950° C., holding the wafer at approximately 950° C. for approximately 10 minutes in dry oxygen, and ramping down the wafer to room temperature in approximately five minutes in an oxygen environment. The thickness of this thin oxide layer is approximately 325 angstroms. This oxide layer is not essential to this invention. However, if utilized, this layer serves two purposes. First, it aids the photoresist utilized in the next process step to adhere to the surface of the wafer. Secondly, it improves the dielectric strength of the to-be-formed dielectric layer, if silicon nitride is used as the dielectric, as will be explained later. The polycrystalline silicon is then patterned (FIG. 2b) utilizing well-known masking and etching techniques, forming a plurality of regions of polycrystalline silicon of which polysilicon region 22 is shown in FIG. 2b. Because such masking and etching techniques used in the patterning of polycrystalline silicon are well-known in the art, they will not be described in detail here.

Insulation layer 23 (FIG. 2c) is then formed over the entire surface of the wafer utilizing well-known low pressure chemical vapor deposition. Layer 23, if comprised of silicon nitride, is formed to a thickness of approximately 300 angstroms if layer 23 is to serve as a dielectric between polycrystalline silicon capacitor plates. Layer 23 (again if comprised of silicon nitride) is formed to a thickness of approximately 2,000 angstroms if layer 23 is to serve as insulation between dual layer polycrystalline silicon interconnects. A layer of oxide (not shown) may be grown on nitride layer 23 to a thickness of approximately 300 angstroms. Such a layer of oxide is grown by thermal oxidation in dry oxygen at approximately 950° C. for approximately 30 minutes if desired to increase the dielectric strength, as is explained later.

Polycrystalline silicon layer 24 (FIG. 2d) is then deposited to a thickness of approximately 4,250 angstroms utilizing well-known low pressure polycrystalline silicon deposition techniques. Polycrystalline silicon layer 24 is then doped in a manner similar to the manner in which polycrystalline silicon layer 22 was doped, as described above. The resistivity of polycrystalline silicon layer 24 after this doping is approximately 25 ohms/square. A very thin layer, approximately 150 angstroms, of oxide (not shown) is then formed on polycrystalline silicon layer 24 by subjecting the wafer to a ramp up of approximately five minutes in dry $O_2$ to approximately 950° C., holding the wafer at approximately 950° C. for approximately 25 minutes in dry $O_2$, and ramping down the wafer to room temperature in approximately five minutes in an oxygen environment. As mentioned previously, this oxidation step is not essential in the practice of this invention, but allows the photoresist used in the next step to be more adhesive to the wafer. Polycrystalline silicon layer 24 is then patterned using well-known techniques (preferably etching with $CF_\gamma$ plasma) thus selectively forming regions 24 of polycrystalline silicon, as shown in FIG. 2e, resulting in interconnects or capacitor plates as desired. Polycrystalline silicon 24 serves to protect insulation layer 23 from chemical attack, during the patterning of polysilicon 24 as well as during subsequent processing steps.

Figure 2F:
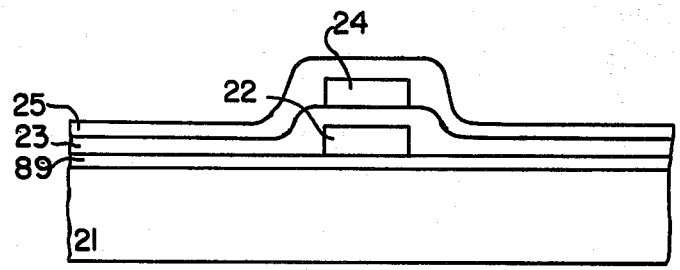

Glass insulating layer 25 is then formed in a well-known manner over the surface of the wafer, as shown in FIG. 2f. Insulation layer 25 may be in the form of phosphorus-doped glass (vapox) formed to a thickness of approximately 1.2 microns. Insulation layer 25 serves to electrically insulate polycrystalline silicon regions 22 and 24 from to-be-formed metallization interconnect layers (not shown). Subsequent to the formation of insulation layer 25, contact openings (not shown) may be formed to allow electrical connection with various regions located within substrate 21, as well as to polycrystalline silicon regions 22 and 24, as desired. Metalization regions (not shown) are then formed to provide electrical connection between various locations in the device. Since the formation of contact openings and metalization interconnects is well-known in the prior art, their fabrication is not described in detail here.

Of importance, the formation of insulating layer 23 located between polycrystalline silicon regions 22 and 24 may comprise a variety of configurations. For example, insulation region 23 may comprise silicon dioxide. Insulation region 23 more preferably comprises silicon nitride, silicon nitride having a dielectric constant approximately twice that of silicon oxide. Thus, a capacitor may be formed having a dielectric layer comprised of silicon nitride which is twice as thick as the dielectric layer of a capacitor of comparable capacitance utilizing silicon dioxide as the dielectric. Thus, the thickness of a dielectric layer comprising silicon nitride may be increased over the thickness of a comparable oxide dielectric layer, thus reducing the effect of dielectric defects, thereby reducing the possibility of electrical shorts between polysilicon regions 22 and 24. Alternatively, the silicon nitride dielectric is formed to a thickness equal to the thickness of prior art silicon dioxide dielectrics, thus forming a capacitor having twice the capacitance of prior art capacitors of similar surface area.

Figure 3A:
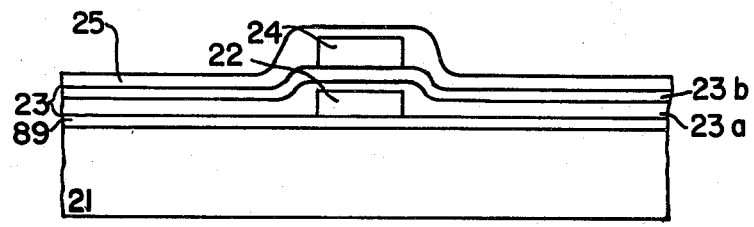
FIG. 3a is a cross sectional view of another embodiment of this invention.
Figure 3B:
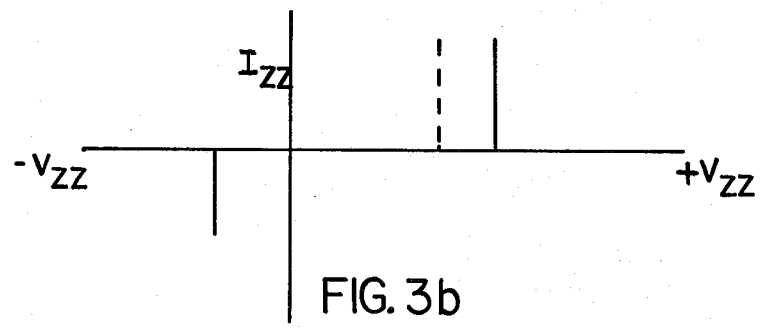
Figure 4B:
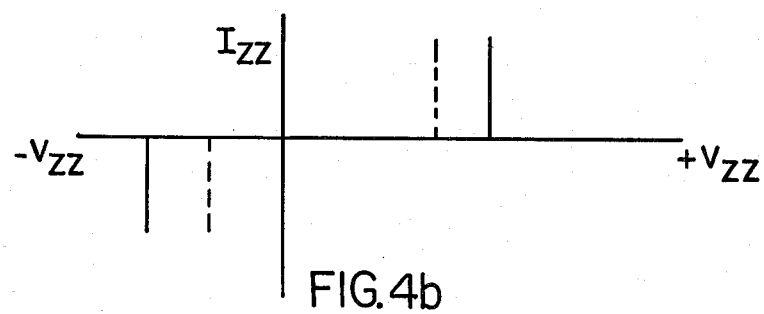

I have also discovered that the use of a thin layer of oxide 23a in conjunction with a silicon nitride dielectric layer 23b, as shown in FIG. 3a, results in a dielectric 23 having the unique breakdown characteristic shown in FIG. 3b. FIG. 3b is a graphical representation of the dielectric breakdown voltage of the capacitor of FIG. 3a comprised of polycrystalline silicon region 22, dielectric layer 23 comprising oxide layer 23a approximately 150 angstroms in thickness and silicon nitride layer 23b approximately 300 angstroms in thickness, and polycrystalline silicon region 24. With polysilicon region 22 at ground potential, a positive voltage applied to region 24 must have a magnitude of approximately 70 volts to cause dielectric breakdown of region 23. However, reversing this polarity, a negative voltage having a magnitude of approximately 40 volts must be applied to region 22 to cause dielectric breakdown of region 23.

Figure 4A:
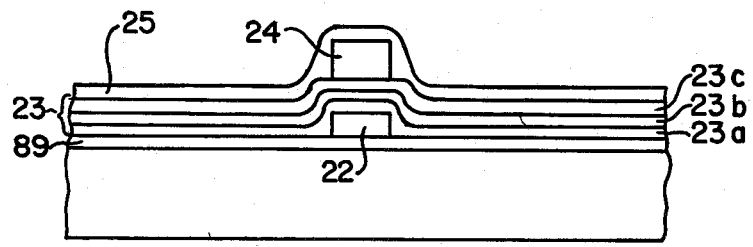
FIG. 4a is a cross sectional view of another embodiment of this invention.

In a similar manner, use of thin oxide layers 23a and 23c (FIG. 4a), each having a thickness of approximately 150 angstroms, on each side of silicon nitride layer 23b (having a thickness of approximately 300 angstroms) shown in FIG. 4a results in a positive breakthrough voltage of approximately 70 volts, as well as a negative breakthrough voltage of approximately 70 volts.

While many specific processes and configurations have been indicated in this specification, they are not intended to be limitations on this invention, and to those skilled in the art, many variations in configurations and processing may be utilized without detracting from the spirit of this invention.

I claim:

1. A capacitor for use in an integrated circuit comprising:
   a first insulation layer formed on a semiconductor substrate;
   a first polycrystalline silicon region formed on said insulating layer;
   a second insulation layer formed on the surface of said first polycrystalline silicon region; said second insulation layer comprising a first layer of silicon dioxide, a layer of silicon nitride located on said first layer of silicon oxide, and a second layer of silicon dioxide located on said layer of silicon nitride; and
   a second polycrystalline silicon region formed on said second insulation layer and located above and insulated from said first polycrystalline silicon region.

2. Structure as in claim 1 wherein one or both of said first and said second polycrystalline silicon regions are doped with a selected dopant, thereby increasing their conductivity.

3. Structure as in claim 2 wherein said dopant is phosphorus.

4. Structure as in claims 1 or 2 wherein said first insulation layer comprises material selected from the group of materials consisting of silicon dioxide and silicon nitride.

5. Structure as in claim 1 wherein said layers of silicon dioxide have a thickness of approximately 150 angstroms and said layer of silicon nitride has a thickness of approximately 300 angstroms.

6. An interconnection structure for use in an integrated circuit comprising:
   a first insulation region formed on a semiconductor substrate;
   a first polycrystalline silicon region formed on said first insulation region;
   a second insulation region formed on the surface of said substrate and covering said first polycrystalline silicon region; said second insulation region comprising a first layer of silicon dioxide, a layer of silicon nitride located on said first layer of silicon dioxide, and a second layer of silicon dioxide located on said layer of silicon nitride; and
   a second polycrystalline silicon region formed on said second insulating region and located above and insulated from said first polycrystalline silicon region.

7. Structure as in claim 6 wherein said first and said second polycrystalline silicon regions are doped with a selected dopant, thereby increasing their conductivity.

8. Structure as in claim 7 wherein said dopant is phosphorus.

9. Structure as in claim 6 wherein said layers of silicon dioxide have a thickness of approximately 400 angstroms and said layer of silicon nitride has a thickness of approximately 2,000 angstroms.

* * * * *